United States Patent
Park

(10) Patent No.: US 7,894,225 B2
(45) Date of Patent: Feb. 22, 2011

(54) SWITCHED CURRENT MEMORY CELL

(75) Inventor: Yong Woon Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 160 days.

(21) Appl. No.: 12/402,639

(22) Filed: Mar. 12, 2009

(65) Prior Publication Data

US 2010/0073981 A1    Mar. 25, 2010

(30) Foreign Application Priority Data

Sep. 19, 2008  (KR) .................. 10-2008-0092398

(51) Int. Cl.
*G11C 27/00* (2006.01)

(52) U.S. Cl. ............... 365/45; 365/189.09; 365/189.11; 365/224

(58) Field of Classification Search ............ 365/45, 365/189.09, 189.11, 224
See application file for complete search history.

(56) References Cited

U.S. PATENT DOCUMENTS

| | | | |
|---|---|---|---|
| 5,400,273 A | | 3/1995 | Hughes et al. |
| 5,745,400 A | * | 4/1998 | Hughes et al. ............... 365/45 |
| 5,798,960 A | * | 8/1998 | Hughes ....................... 365/45 |
| 6,643,193 B2 | * | 11/2003 | Yamaki et al. ......... 365/189.09 |

* cited by examiner

*Primary Examiner*—Pho M Luu
(74) *Attorney, Agent, or Firm*—Lowe, Hauptman, Ham & Berner, LLP

(57) ABSTRACT

A switched current memory cell includes a current source 100 having one end connected to an operation power source (Vdd) stage, a current memory circuit unit 200 that stores an input current; which is inputted in a sampling mode of the current from the current source 100, during a hold mode, maintains the current value stored in the hold mode, and outputs the stored current in an output mode, an input switch SW10 that is turned on in the sampling mode to transfer an input current to the current memory circuit unit 200, and turned off in the hold mode, an output switch SW20 that is turned on in the output mode to output current from the current memory circuit unit 200, and a current cut circuit unit 300 that connects a current path between the operation power source Vdd stage and the current source 100 in the input mode and output mode, and separates the current path between the operation power source Vdd stage and the current source 100 in the hold mode.

8 Claims, 3 Drawing Sheets

SWITCHED CURRENT MEMORY CELL

CROSS-REFERENCE TO RELATED APPLICATIONS

This application claims the priority of Korean Patent Application No. 2008-0092398 filed on Sep. 19, 2008, in the Korean Intellectual Property Office, the disclosure of which is incorporated herein by reference.

BACKGROUND OF THE INVENTION

1. Field of the Invention

The present invention relates to a switched current memory cell adaptive to a current mode serial-to-parallel converter or a current mode parallel-to-serial converter of an OFDM system and, more particularly, to a switched current memory cell capable of reducing power consumption by cutting off unnecessary current in a hold mode of a single line or double line memory cell.

2. Description of the Related Art

In general, an orthogonal frequency division multiplexing (OFDM) communication scheme is used to accomplish high speed communications of 20 Mbps or faster, and such OFDM communication scheme realizing high speed communications of 20 Mps or faster is making rapid progress as a $4^{th}$-generation communication scheme beyond IMT-2000.

In a wireless communication system using the OFDM system, a baseband signal processing unit consumes power of about 300 mW or more for an A/D converter, a D/A converter, and a DSP (Digital System Processing) FFT (Fast Fourier Transform) LSI, which poses an obstacle to the wireless communication system.

Meanwhile, in the OFDM system, an analog Fourier Transform LSI using a current mode has been proposed as a solution to power consumption, and in order to employ such signal processing method, a memory cell, compared with a voltage memory cell, is considered to be suitable for a serial-to-parallel converter or parallel-to-serial converter, and as such the memory cell receives much attention.

The related art current memory cell is configured as a single line or double line memory cell. The single line current memory cell is formed as a circuit including a single current path from a power source stage to a ground stage, and the double line current memory cell is formed as a circuit including two current paths from the power source stage to the ground stage.

However, in the related art current memory cell including a sampling mode in which an input current is sampled, a hold mode in which a sampled current is stored and maintained, and an output mode in which the stored current is outputted, current flows continuously across the memory cell in the hold mode, resulting in a waste of current.

SUMMARY OF THE INVENTION

An aspect of the present invention provides a switched current memory cell capable of reducing power consumption by cutting off unnecessary current in a hold mode in a single line or double line memory cell.

According to an aspect of the present invention, there is provided a switched current memory cell including: a current source having one end connected to an operation power source stage; a current memory circuit unit storing an input current in a sampling mode according to current from the current source, maintaining the stored current value in a hold mode, and outputting the stored current in an output mode; an input switch turned on in the sampling mode to transfer the input current to the current memory circuit unit, and turned off in the hold mode; an output switch turned on in the output mode to output the current from the current memory circuit unit; and a current cut circuit unit connecting a current path between the operation power source stage and the current source in the input mode and the output mode, and separating the current path between the operation power source stage and the current source in the hold mode.

The switched current memory cell may include an operation switch connected between a current input node of the current memory circuit unit and a gate of an internal transistor, and the operation switch may be turned on before the input switch does, and may be turned off in the output mode.

The current source may include a pair of first transistors and a pair of second transistors, respective sources of two PMOS transistors of the pair of first transistors may be connected to the operation power source stage via the current cut circuit unit, gates of the two PMOS transistors of the pair of first transistors may be connected to each other and also connected to a first bias voltage stage, a source of one PMOS transistor of the pair of second transistors may be connected to a drain of one PMOS transistor of the pair of first transistors, a source of the other PMOS transistor of the pair of second transistors may be connected to a drain of the other PMOS transistor of the pair of first transistors, and gates of the two PMOS transistors of the pair of second transistors may be connected to each other and also may be connected to a second bias voltage stage.

The current memory circuit unit may include a pair of third transistors and a pair of fourth transistors, a drain of one NMOS transistor of the pair of third transistors may be connected to a drain of one PMOS transistor of the pair of second transistors, a drain of the other NMOS transistor of the pair of third transistors may be connected to a drain of the other PMOS transistor of the pair of second transistors, gates of the two NMOS transistors of the pair of third transistors may be connected to each other and also may be connected to a third bias voltage stage, a drain of one NMOS transistor of the pair of fourth transistors may be connected to a source of one NMOS transistor of the pair of third transistors, a drain of the other NMOS transistor of the pair of fourth transistors may be connected to a drain of the other NMOS transistor of the pair of third transistors, gates of the two NMOS transistors of the pair of fourth transistors may be connected to each other, and sources of the two NMOS transistors of the pair of fourth transistors are connected to a ground.

The input switch may include an input NMOS transistor having a drain connected to an input stage, a source connected to a connection node of one PMOS transistor of the pair of second transistors and one NMOS transistor of the pair of third transistors, and a gate connected to a first switching signal.

The output switch may include an output NMOS transistor having a source connected to an output stage, a drain connected to a connection node of the other PMOS transistor of the pair of second transistors and the other NMOS transistor of the pair of third transistors, and a gate connected to a second switching signal.

The operation switch may include one NMOS operation transistor having a drain connected to a connection node of one PMOS transistor of the pair of second transistors and one NMOS transistor of the pair of third transistors, and a gate connected to a third switching signal; and the other NMOS operation transistor having a drain connected to a source of the one NOMS transistor of the operation switch, a gate connected to an inverse third switching signal, and a source connected to the gates of the two NMOS transistors of the pair of fourth transistors and also connected to a source of the one NMOS operation transistor.

The current cut circuit unit may include a pair of fifth transistors and a pair of sixth transistors, one PMOS transistor of the pair of fifth transistors may have a source connected to the operation power source stage, a drain connected to the source of one PMOS transistor of the pair of first transistors, and a gate connected to the inverse third switching signal, the other PMOS transistor of the pair of fifth transistors may have a source connected to the operation power source stage, a drain connected to the source of one PMOS transistor of the pair of first transistors, and a gate connected to an inverse second switching signal, one PMOS transistor of the pair of sixth transistors may have a source connected to the operation power source stage, a drain connected to the source of the other PMOS transistor of the pair of first transistors, and a gate connected to the inverse third switching signal, and the other PMOS transistor of the pair of sixth transistors may have a source connected to the operation power source stage, a drain connected to the source of the other PMOS transistor of the pair of first transistors, and a gate connected to the inverse second switching signal.

According to the present invention, in the single line or double line memory cell, unnecessary current in the hold mode is cut off to thus reduce power consumption.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
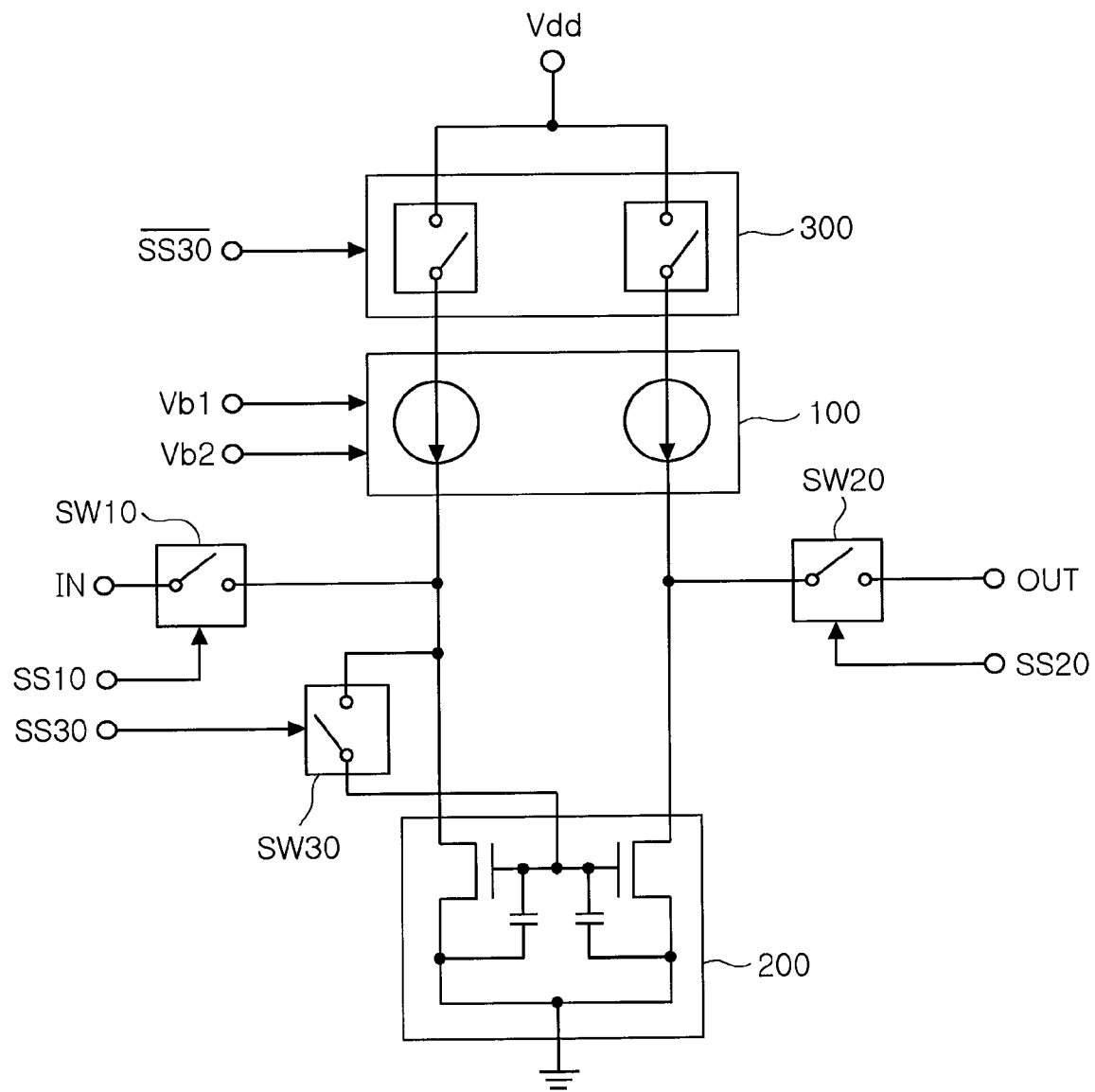
FIG. 1 is a block diagram of a switched current memory cell according to an exemplary embodiment of the present invention.

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a block diagram of a switched current memory cell according to an exemplary embodiment of the present invention.

With reference to FIG. 1, the switched current memory cell according to an embodiment of the present invention includes a current source 100 having one end connected to an operation power source Vdd stage, a current memory circuit unit 200 that stores an input current, which is inputted in a sampling mode according to current from the current source 100, during a hold mode, maintains the current value stored in the hold mode, and outputs the stored current in an output mode, an input switch SW10 that is turned on in the sampling mode to transfer an input current to the current memory circuit unit 200, and turned off in the hold mode, an output switch SW20 that is turned on in the output mode to output current from the current memory circuit unit 200, and a current cut circuit unit 300 that connects a current path between the operation power source Vdd stage and the current source 100 in the input mode and output mode, and separates the current path between the operation power source Vdd stage and the current source 100 in the hold mode.

The switched current memory cell includes an operation switch SW30 connected between a current input node of the current memory circuit unit 200 and a gate of an internal transistor, and the operation switch SW30 is turned on before the input switch SW10 does, and turned off in the output mode.

Figure 2:
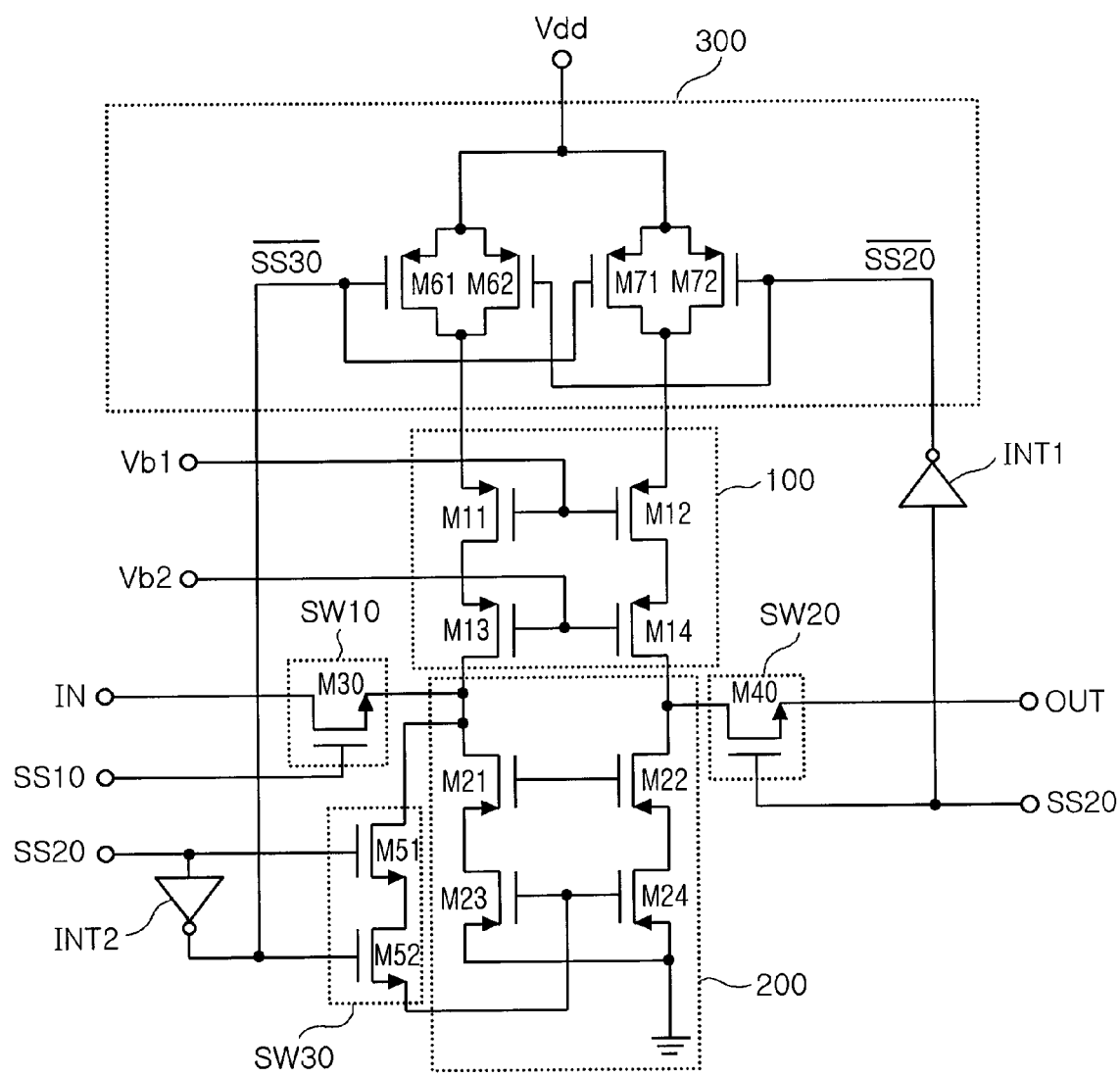
FIG. 2 is a detailed view of the switched current memory cell according to an exemplary embodiment of the present invention.

FIG. 2 is a detailed view of the switched current memory cell according to an exemplary embodiment of the present invention. With reference to FIG. 2, the current source 100 includes a pair of first transistors M11 and M12 and a pair of second transistors M13 and M14. Sources of the two PMOS transistors of the pair of first transistors M11 and M12 are connected to the operation power source Vdd stage via the current cut circuit unit 300, gates of the two PMOS transistors of the pair of first transistors M11 and M12 are connected to each other and also connected to a first bias voltage Vb1 stage. A source of one PMOS transistor M13 of the pair of second transistors M13 and M14 is connected to a drain of one PMOS transistor M11 of the pair of first transistors M11 and M12, a source of the other PMOS transistor M14 of the pair of second transistors M13 and M14 is connected to a drain of the other PMOS transistor M12 of the pair of first transistors M11 and M12, and gates of two PMOS transistors M13 and M14 of the pair of second transistors M13 and M14 are connected to each other and also connected to a second bias voltage Vb2 stage.

With reference to FIGS. 1 and 2, the current memory circuit unit 200 includes a pair of third transistors M21 and M22 and a pair of fourth transistors M23 and M24. A drain of one NMOS transistor M21 of the pair of third transistors M21 and M22 is connected to a drain of one PMOS transistor M13 of the pair of second transistors M13 and M14, a drain of the other NMOS transistor M22 of the pair of third transistors M21 and M22 is connected to a drain of the other PMOS transistor M14 of the pair of second transistors M13 and M14, and gates of the two NMOS transistors M21 and M22 of the pair of third transistors M21 and M22 are connected to each other and also connected to a third bias voltage Vb3 stage. A drain of one NMOS transistor M23 of the pair of fourth transistors M23 and M24 is connected to a source of one NMOS transistor M21 of the pair of third transistors M21 and M22, a drain of the other NMOS transistor M23 of the pair of fourth transistors M23 and M24 is connected to a drain of the other NMOS transistor M22 of the pair of third transistors M21 and M22, the gates of the two NMOS transistors M23 and M24 of the pair of fourth transistors M23 and M24 are connected to each other, and sources of the two NMOS transistors M23 and M24 of the pair of fourth transistors M23 and M24 are connected to a ground.

With reference to FIGS. 1 and 2, the input switch SW10 includes an input NMOS transistor M30 having a drain connected to an input stage IN, a source connected to a connection node of one PMOS transistor M13 of the pair of second transistors M13 and M14 and one NMOS transistor M21 of the pair of third transistors M21 and M22, and a gate connected to a first switching signal SS10.

The output switch SW20 includes an output NMOS transistor M40 having a source connected to an output stage OUT, a drain connected to a connection node of the other PMOS transistor M14 of the pair of second transistors M13 and M14 and the other NMOS transistor M22 of the pair of third transistors M21 and M22, and a gate connected to a second switching signal SS20.

The operation switch SW30 includes one NMOS operation transistor M51 having a drain connected to a connection node of one PMOS transistor M13 of the pair of second transistors M13 and M14 and one NMOS transistor M21 of the pair of third transistors M21 and M22 and a gate connected a third switching signal SS30, and the other NMOS operation transistor M52 having a drain connected to a source of one NMOS transistor M51 of the operation switch SW30, a gate connected to an inverse third switching signal $\overline{SS30}$, and a source connected to gates of the two NMOS transistors of the pair of fourth transistors M23 and M24 and also connected to a source of one NMOS operation transistor M51.

The current cut circuit unit 300 includes a pair of fifth transistors M61 and M62 and a pair of sixth transistors M71 and M72. One PMOS transistor M61 of the pair of fifth transistors M61 and M62 has a source connected to the operation power source Vdd stage, a drain connected to the source of one PMOS transistor M11 of the pair of first transistors M11 and M12, and a gate connected to the inverse third switching signal $\overline{SS30}$. The other PMOS transistor M62 of the pair of fifth transistors M61 and M62 has a source connected to the operation power source Vdd stage, a drain connected to the source of one PMOS transistor M11 of the pair of first transistors M11 and M12, and a gate connected to an inverse second switching signal $\overline{SS20}$.

Of the current cut circuit unit 300, one PMOS transistor M71 of the pair of sixth transistors M71 and M72 has a source connected to the operation power source Vdd stage, a drain connected to the source of the other PMOS transistor M12 of the pair of first transistors M11 and M12, and a gate connected to the inverse third switching signal $\overline{SS30}$. The other PMOS transistor M72 of the pair of sixth transistors M71 and M72 has a source connected to the operation power source Vdd stage, a drain connected to the source of the other PMOS transistor M12 of the pair of first transistors M11 and M12, and a gate connected the inverse second switching signal $\overline{SS20}$.

Figure 3:
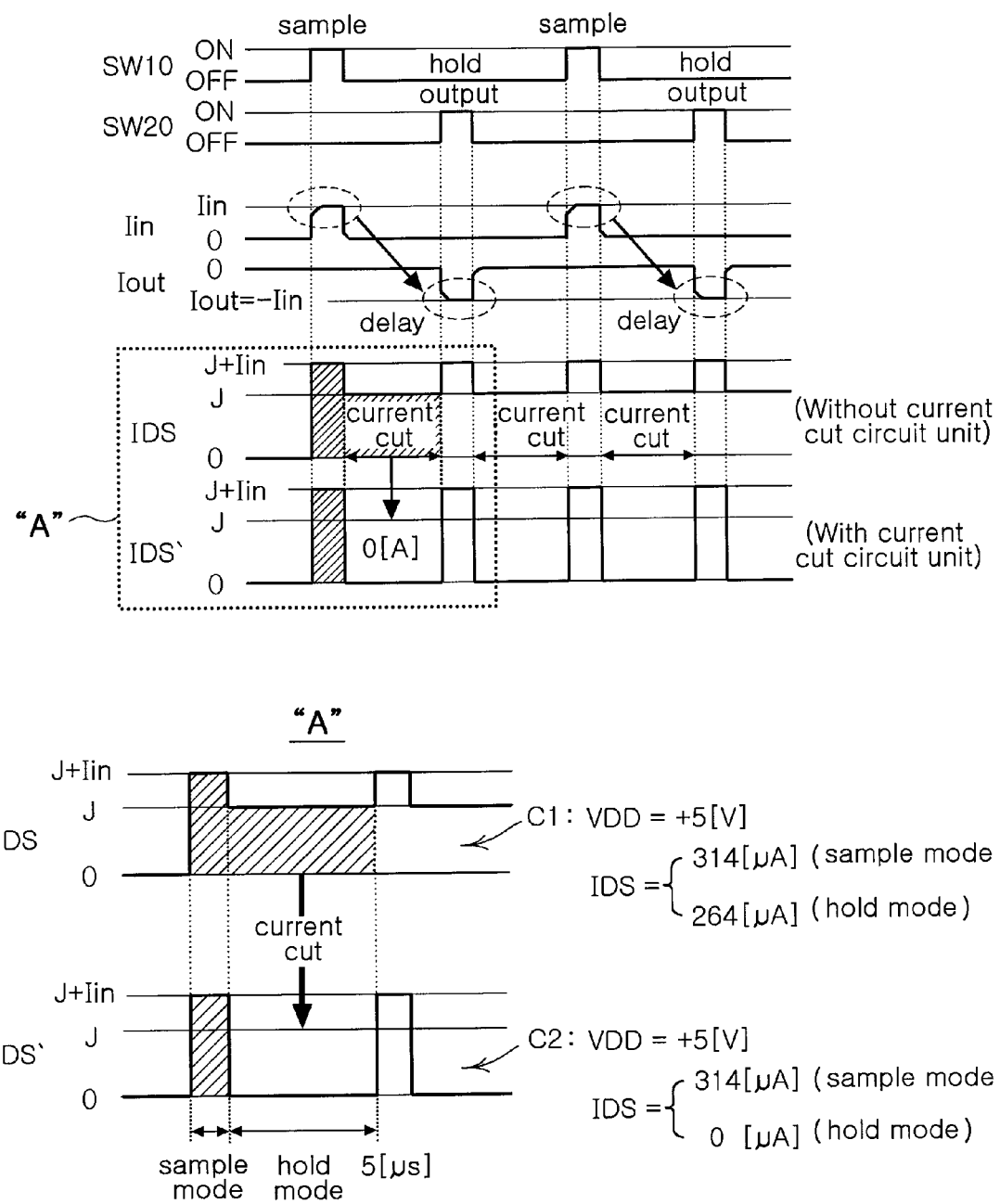
FIG. 3 is a timing chart with respect to a sample mode, a hold mode, and an output mode according to an exemplary embodiment of the present invention.

FIG. 3 is a timing chart with respect to a sample mode, a hold mode, and an output mode according to an exemplary embodiment of the present invention. As shown in FIG. 3, in the sample mode, the input switch SW10 is turned on while the output switch SW20 is turned off. In the hold mode, the input switch SW10 is turned off, and in the output mode, the output switch SW20 is turned on.

In FIG. 3, Iin is an input current which has a high level in the sample mode, and Iout is an output current which has a high level in the output mode. IDS is current flowing across the current memory circuit unit 200. States of the respective operation modes with the current will now be described.

First, in the sample mode, the current IDS flowing across the current memory circuit unit 200 is equivalent to the sum (J+Iin) of a current (J) by the current source 100 and the input current Iin.

Next, in the hold mode, if the current cut circuit unit 300 according to the present invention is not provided, the current IDS flowing across the current memory circuit unit 200 would be equivalent to the current (J) by the current source 100. But, in the present invention, the current cut circuit unit 300 cuts off current supply in the hold mode, so the current IDS flowing across the current memory circuit unit 200 is 0 [A].

In the output mode, the current IDS flowing across the current memory circuit unit 200 is equivalent to the sum (J+Iin) of the current (J) by the current source and the input current Iin.

The operation and effect of the present invention will be described in detail with reference to the accompanying drawings as follows.

With reference to FIGS. 1 to 3, the switched current memory cell according to exemplary embodiments of the present invention include the current source 100, the current memory circuit unit 200, the input switch SW10, the operation switch SW30, the output switch SW20, and the current cut circuit unit 300.

The operation of the switched current memory cell will be described discriminately based on the sample mode, the hold mode, and the output mode.

First, with reference to FIGS. 1 and 2, in the sample mode of the switched current memory cell, the first switching signal SS10 has a high level, the second switching signal SS20 has a low level, and the third switching signal SS30 has a high level.

Namely, because the second switching signal SS20 has a low level, the inverse second switching signal $\overline{SS20}$ has a high level, and because the third switching signal SS30 has a high level, the inverse third switching signal $\overline{SS30}$ has a low level.

Because the inverse third switching signal $\overline{SS30}$ has a low level, the PMOS transistors M61 and M71, among the pair of fifth transistors M61 and M62 and the pair of sixth transistors M71 and M72, included in the current cut circuit unit 300 according to the present invention are turned on.

With the PMOS transistors M61 and M72 of the current cut circuit unit 300 turned on, power of the operation power source Vdd is supplied to the current source 100 via the PMOS transistors M61 and M71, so the current source 100 generates a constant current (J) as shown in FIG. 3 and supplies it to the current memory circuit unit 200, and accordingly, the constant current (J) by the current source 100 flows across the current memory circuit unit 200.

The current source 100 includes the pair of first transistors M11 and M12 and the pair of second transistors M13 and M14 formed of the PMOS transistors, which are biased by the first and second bias voltages Vb1 and Vb2 to generate the uniform current (J) connected to the operation power source Vdd via the current memory circuit unit 200 and supply the current (J) to the current memory circuit unit 200.

In this state, the NMOS transistor M30 of the input switch SW10 is turned by the first switching signal SS10 with the high level, so the input current Iin flows to the current memory circuit unit 200.

In the current memory circuit unit 200, the pair of third transistors M21 and M22 are biased by the third bias voltage Vb3, and the pair of fourth transistors M23 and M24 are biased by the voltage via the operation switch SW30, and accordingly, the current memory circuit unit 200 can store the input current.

Namely, in the sample mode, as shown in FIG. 3, the current IDS flowing across the current memory circuit unit 200 is equivalent to the sum (J+Iin) of the current (J) by the current source 100 and the input current Iin.

Next, in the hold mode, the first switching signal SS10 has a low level, the second switching signal SS20 has a low level, and the third switching signal SS30 has a low level.

Thus, because the second switching signal SS20 has a low level, the inverse second switching signal $\overline{SS20}$ has a high level, and because the third switching signal SS30 has a low level, the inverse third switching signal $\overline{SS30}$ also has a high level.

Because the inverse second switching signal $\overline{SS20}$ has a high level, the PMOS transistors M62 and M72, among the pair of fifth transistors M61 and M62 and the pair of sixth transistors M71 and 72 included in the current cut circuit unit 300, are turned off, and at the same time, because the inverse third switching signal $\overline{SS30}$ has a high level, the PMOS transistors M61 and M71, among the pair of fifth transistors M61 and M62 and the pair of sixth transistors M71 and M72 included in the current cut circuit unit 300, are turned off.

Namely, all the PMOS transistors of the current cut circuit unit 300 are turned off, power supply from the operation power source Vdd is cut off, so the current (j) is not generated from the current source 100.

Accordingly, the constant current (J) by the current source 100 does not flow to the current memory circuit unit 200.

Therefore, in the hold mode, as shown in FIG. 3, because the current (J) is not generated from the current source 100, the current IDS flowing across the current memory circuit 200 is 0 [A].

In the output mode, the first switching signal SS10 has a low level, the second switching signal SS20 has a high level, and the third switching signal SS30 has a low level.

Namely, because the second switching signal SS20 has a high level, the inverse second switching signal $\overline{SS20}$ has a low level, and because the third switching signal SS30 has a low level, the inverse third switching signal $\overline{SS30}$ has a high level.

Because the inverse second switching signal $\overline{SS20}$ has a low level, the PMOS transistors M62 and M72, among the pair of fifth transistors M61 and M62 and the pair of sixth transistors M71 and M72 included in the current cut circuit unit 300, are turned on, and because the inverse third switching signal $\overline{SS30}$ has a high level, the PMOS transistors M61 and M71, among the pair of fifth transistors M61 and M62 and the pair of sixth transistors M71 and M72, are turned off.

As the PMOS transistors M62 and M72 of the current cut circuit unit 300 are turned, power of the operation power source Vdd is supplied to the current source 100 via the PMOS transistors M62 and M72, and accordingly, the current source 100 generates the constant current (J) as shown in FIG. 3 and supplies it to the current memory circuit unit 200. Thus, the constant current (J) by the current source 100 flows across the current memory circuit unit 200.

With reference to FIG. 3, in the sample mode, the input switch SW10 is turned on and the output switch SW20 is turned off. In the hold mode, the input switch SW10 is turned off, and in the output mode, the output switch SW20 is turned on.

First, in the sample mode, the current IDS flowing across the current memory circuit unit 200 is equivalent to the sum (J+Iin) of the current (J) by the current source and the input current (Iin).

Next, in the hold mode, if the current cut circuit unit 300 according to the present invention is not provided, the current IDS flowing across the current memory circuit unit 200 would be equivalent to the current (J) by the current source 100. But, in the present invention, the current cut circuit unit 300 cuts off current supply in the hole mode, so the current IDS flowing across the current memory circuit unit 200 is 0 [A].

In the output mode, the current IDS flowing across the current memory circuit unit 200 is equivalent to the sum (J+Iin) of the current (J) by the current source and the input current Iin.

As set forth above, according to exemplary embodiments of the invention, in the single line or double line memory cell, unnecessary current is cut off in the hold mode, thus reducing power consumption.

While the present invention has been shown and described in connection with the exemplary embodiments, it will be apparent to those skilled in the art that modifications and variations can be made without departing from the spirit and scope of the invention as defined by the appended claims.

What is claimed is:

1. A switched current memory cell comprising:
    a current source having one end connected to an operation power source stage;
    a current memory circuit unit storing an input current in a sampling mode according to current from the current source, maintaining the stored current value in a hold mode, and outputting the stored current in an output mode;
    an input switch turned on in the sampling mode to transfer the input current to the current memory circuit unit, and turned off in the hold mode;
    an output switch turned on in the output mode to output the current from the current memory circuit unit; and
    a current cut circuit unit connecting a current path between the operation power source stage and the current source in the input mode and the output mode, and separating the current path between the operation power source stage and the current source in the hold mode.

2. The memory cell of claim 1, further comprising:
    an operation switch SW30 connected between a current input node of the current memory circuit unit and a gate of an internal transistor, wherein the operation switch SW30 is turned on before the input switch does, and is turned off in the output mode.

3. The memory cell of claim 2, wherein the current source comprises a pair of first transistors M11 and M12 and a pair of second transistors M13 and M14, respective sources of two PMOS transistors of the pair of first transistors M11 and M12 are connected to the operation power source stage via the current cut circuit unit, gates of the two PMOS transistors of the pair of first transistors M11 and M12 are connected to each other and also connected to a first bias voltage Vb1 stage,
    a source of one PMOS transistor M13 of the pair of second transistors M13 and M14 is connected to a drain of one PMOS transistor M11 of the pair of first transistors M11 and M12, a source of the other PMOS transistor M14 of the pair of second transistors M13 and M14 is connected to a drain of the other PMOS transistor M12 of the pair of first transistors M11 and M12, and gates of the two PMOS transistors M13 and M14 of the pair of second transistors M13 and M14 are connected to each other and also connected to a second bias voltage Vb2 stage.

4. The memory cell of claim 3, wherein the current memory circuit unit comprises a pair of third transistors M21 and M22 and a pair of fourth transistors M23 and M24,
    a drain of one NMOS transistor M21 of the pair of third transistors M21 and M22 is connected to a drain of one PMOS transistor M13 of the pair of second transistors M13 and M14, a drain of the other NMOS transistor M22 of the pair of third transistors M21 and M22 is connected to a drain of the other PMOS transistor M14 of the pair of second transistors M13 and M14, and gates of the two NMOS transistors M21 and M22 of the pair of third transistors M21 and M22 are connected to each other and also connected to a third bias voltage Vb3 stage,
    a drain of one NMOS transistor M23 of the pair of fourth transistors M23 and M24 is connected to a source of one NMOS transistor M21 of the pair of third transistors M21 and M22, a drain of the other NMOS transistor M24 of the pair of fourth transistors M23 and M24 is connected to a drain of the other NMOS transistor M22 of the pair of third transistors M21 and M22, gates of the two NMOS transistors M23 and M24 of the pair of fourth transistors M23 and M24 are connected to each other, and sources of the two NMOS transistors M23 and M24 of the pair of fourth transistors M23 and M24 are connected to a ground.

5. The memory cell of claim 4, wherein the input switch SW10 comprises an input NMOS transistor M30 having a drain connected to an input stage IN, a source connected to a connection node of one PMOS transistor of the pair of second transistors M13 and M14 and one NMOS transistor M21 of the pair of third transistors M21 and M22, and a gate connected to a first switching signal SS10.

6. The memory cell of claim 5, wherein the output switch SW20 comprises an output NMOS transistor M40 having a source connected to an output stage OUT, a drain connected to a connection node of the other PMOS transistor M14 of the pair of second transistors M13 and M14 and the other NMOS transistor M22 of the pair of third transistors M21 and M22, and a gate connected to a second switching signal SS20.

7. The memory cell of claim 6, wherein the operation switch comprises:
one NMOS operation transistor M51 having a drain connected to a connection node of one PMOS transistor M13 of the pair of second transistors M13 and M14 and one NMOS transistor M21 of the pair of third transistors M21 and M22, and a gate connected to a third switching signal SS30; and
the other NMOS operation transistor M52 having a drain connected to a source of the one NOMS transistor M51 of the operation switch SW30, a gate connected to an inverse third switching signal $\overline{SS30}$, and a source connected to the gates of the two NMOS transistors of the pair of fourth transistors M23 and M24 and also connected to a source of the one NMOS operation transistor M51.

8. The memory cell of claim 7, wherein the current cut circuit unit comprises a pair of fifth transistors M61 and M62 and a pair of sixth transistors M71 and M72,
one PMOS transistor M61 of the pair of fifth transistors M61 and M62 has a source connected to the operation power source stage, a drain connected to the source of one PMOS transistor M11 of the pair of first transistors M11 and M12, and a gate connected to the inverse third switching signal $\overline{SS30}$, and the other PMOS transistor M62 of the pair of fifth transistors M61 and M62 has a source connected to the operation power source stage, a drain connected to the source of one PMOS transistor M11 of the pair of first transistors M11 and M12, and a gate connected to an inverse second switching signal $\overline{SS20}$, and
one PMOS transistor M71 of the pair of sixth transistors M71 and M72 has a source connected to the operation power source stage, a drain connected to the source of the other PMOS transistor M12 of the pair of first transistors M11 and M12, and a gate connected to the inverse third switching signal $\overline{SS30}$, and the other PMOS transistor M72 of the pair of sixth transistors M71 and M72 has a source connected to the operation power source stage, a drain connected to the source of the other PMOS transistor M12 of the pair of first transistors M11 and M12, and a gate connected to the inverse second switching signal $\overline{SS20}$.

* * * * *